United States Patent
Neumann

(10) Patent No.: US 11,357,088 B2
(45) Date of Patent: Jun. 7, 2022

(54) MEASUREMENT ARRANGEMENT FOR DETECTING AGING PROCESSES IN INDIVIDUAL LIGHT-EMITTING DIODES

(71) Applicant: Inova Semiconductors GmbH, Munich (DE)

(72) Inventor: Roland Neumann, Munich (DE)

(73) Assignee: Inova Semiconductors GmbH, Munich (DE)

( * ) Notice: Subject to any disclaimer, the term of this patent is extended or adjusted under 35 U.S.C. 154(b) by 0 days.

(21) Appl. No.: 16/467,902

(22) PCT Filed: Nov. 16, 2017

(86) PCT No.: PCT/EP2017/001348
§ 371 (c)(1),
(2) Date: Jun. 7, 2019

(87) PCT Pub. No.: WO2018/103879
PCT Pub. Date: Jun. 14, 2018

(65) Prior Publication Data
US 2020/0072898 A1    Mar. 5, 2020

(30) Foreign Application Priority Data
Dec. 8, 2016 (DE) ..................... 10 2016 014 652.4

(51) Int. Cl.
*G01R 31/26* (2020.01)
*H05B 45/58* (2020.01)
(Continued)

(52) U.S. Cl.
CPC ......... *H05B 45/58* (2020.01); *G01R 31/2635* (2013.01); *G09G 3/006* (2013.01);
(Continued)

(58) Field of Classification Search
CPC .................................................. G01R 31/2635
See application file for complete search history.

(56) References Cited

U.S. PATENT DOCUMENTS 6,127,783 A * 10/2000 Pashley ............... F21V 23/0442
315/149
6,448,550 B1 * 9/2002 Nishimura ............. H05B 45/20
250/226
(Continued)

FOREIGN PATENT DOCUMENTS

DE          10239449 A1    8/2003
DE      102008034524 A1    1/2010
(Continued)

OTHER PUBLICATIONS

International Application No. PCT/EP2017/001348, International Preliminary Report on Patentability dated Mar. 25, 2019 [German only], (Mar. 25, 2019), 20 pgs.
(Continued)

*Primary Examiner* — Walter L Lindsay, Jr.
*Assistant Examiner* — Milton Gonzalez
(74) *Attorney, Agent, or Firm* — Schwegman Lundberg & Woessner, P.A.

(57) ABSTRACT

The present invention relates to a measurement arrangement for detecting aging processes in individual light-emitting diodes which makes it possible to identify, and subsequently to compensate, a loss of brightness in light-emitting diodes. In this context, a relative measurement of brightness intensity is taken. The present invention further relates to a correspondingly set-up method for detecting aging processes in individual light-emitting diodes and to a computer program product comprising control commands which implement the method.

11 Claims, 2 Drawing Sheets

Figure 1:
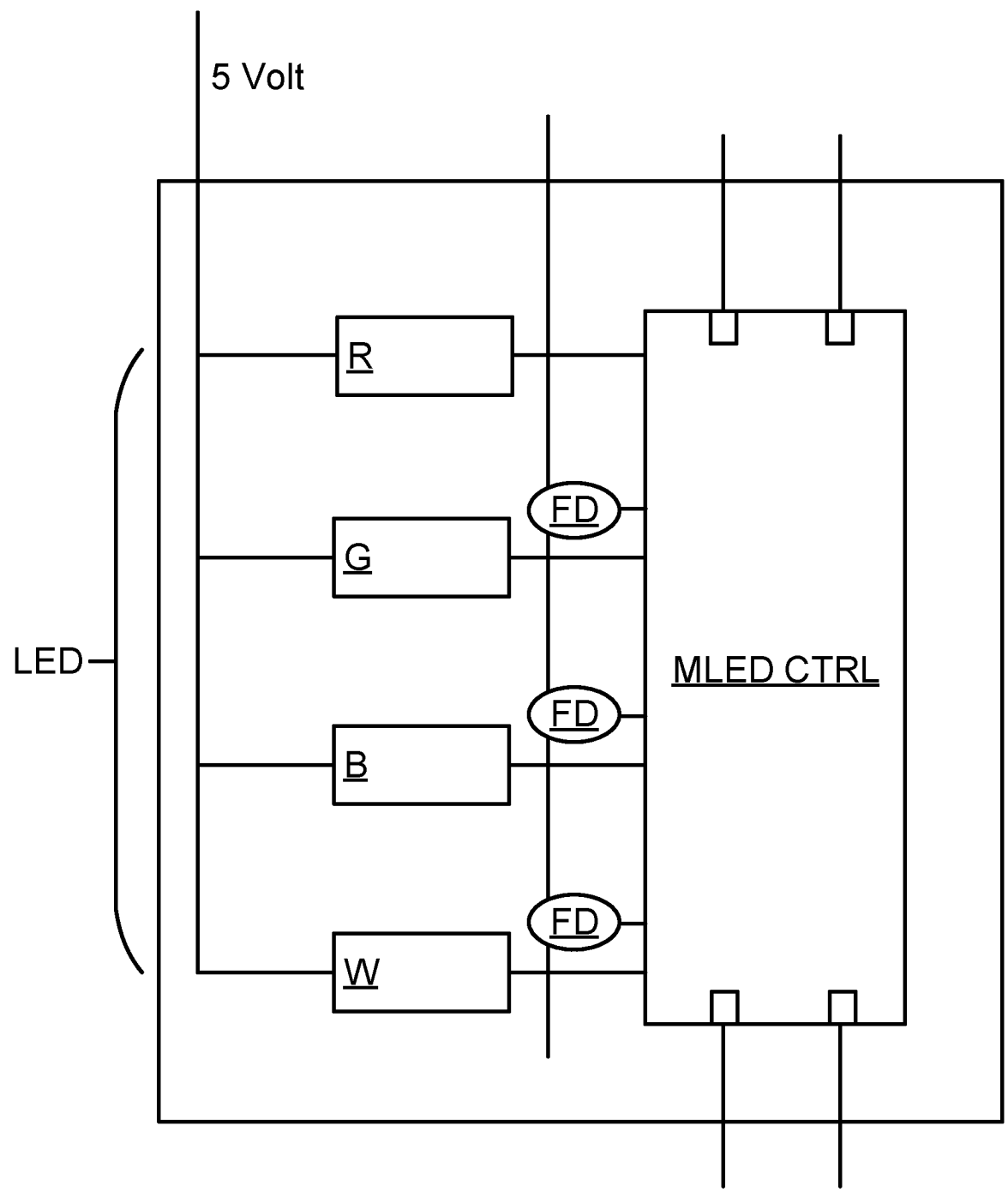

(51) Int. Cl.
*G09G 3/00* (2006.01)
*G09G 3/32* (2016.01)
*H05B 45/10* (2020.01)
*H05B 45/12* (2020.01)

(52) U.S. Cl.
CPC ............... *G09G 3/32* (2013.01); *H05B 45/10* (2020.01); *G09G 2320/0626* (2013.01); *H05B 45/12* (2020.01)

(56) References Cited

U.S. PATENT DOCUMENTS

| | | | | |
|---|---|---|---|---|
| 6,507,159 | B2 * | 1/2003 | Muthu | G01J 3/51 |
| | | | | 315/307 |
| 6,777,883 | B2 * | 8/2004 | Mukherjee | H05B 45/40 |
| | | | | 315/149 |
| 7,315,139 | B1 * | 1/2008 | Selvan | H05B 45/22 |
| | | | | 315/291 |
| 7,327,098 | B2 * | 2/2008 | Chen | H05B 45/10 |
| | | | | 315/291 |
| 7,370,979 | B2 * | 5/2008 | Whitehead | G09G 3/3611 |
| | | | | 353/85 |
| 7,551,158 | B2 * | 6/2009 | Nishimura | G09G 3/3413 |
| | | | | 345/102 |
| 8,004,488 | B2 * | 8/2011 | Park | G09G 3/3406 |
| | | | | 345/102 |
| 8,390,562 | B2 * | 3/2013 | Chen | G09G 3/3413 |
| | | | | 345/102 |
| 2008/0062118 | A1 * | 3/2008 | Park | G09G 3/3413 |
| | | | | 345/102 |
| 2010/0327764 | A1 | 12/2010 | Knapp | |
| 2011/0057571 | A1 | 3/2011 | Ackermann et al. | |
| 2016/0003670 | A1 | 1/2016 | Li et al. | |
| 2016/0343349 | A1 | 11/2016 | Machida et al. | |

FOREIGN PATENT DOCUMENTS

| | | |
|---|---|---|
| DE | 102009053911 A1 | 5/2011 |
| GB | 2475773 A | 6/2011 |
| WO | WO-2018103879 A1 | 6/2018 |

OTHER PUBLICATIONS

"International Application No. PCT/EP2017/001348, International Search Report and Written Opinion dated Jan. 31, 2018", (Jan. 31, 2018), 13 pgs.

* cited by examiner

MEASUREMENT ARRANGEMENT FOR DETECTING AGING PROCESSES IN INDIVIDUAL LIGHT-EMITTING DIODES

PRIORITY CLAIM TO RELATED APPLICATIONS

This application is a U.S. national stage filing under 35 U.S.C. § 371 from International Application No. PCT/EP2017/001348, filed on 16 Nov. 2017, and published as WO2018/103879 on 14 Jun. 2018, which claims the benefit under 35 U.S.C. 119 to German Application No. 10 2016 014 652.4, filed on 8 Dec. 2016, the benefit of priority of each of which is claimed herein, and which applications and publication are hereby incorporated herein by reference in their entirety.

The present invention relates to a measurement arrangement for detecting aging processes in individual light-emitting diodes which makes it possible to identify, and subsequently to compensate, a loss of brightness in light-emitting diodes. In this context, a relative measurement of brightness intensity is taken. The present invention further relates to a correspondingly set-up method for detecting aging processes in individual light-emitting diodes and to a computer program product comprising control commands which implement the method.

US 2016/0003670 A1 shows a measurement arrangement for detecting aging processes in a photodiode.

US 2010/0327764 A1 shows an intelligent lighting control in a LED arrangement for accomplishing a series of functions.

In known methods, absolute brightnesses of light-emitting diodes are measured and stored as soon as they are manufactured. It is subsequently expected to be able to draw conclusions from a plurality of test series of this type, starting from the absolute value of a change in a luminescence property, as to aging processes to be expected in a light-emitting diode. Thus, corresponding parameters are stored for example in a table and often supplied to the end customer in an unalterable form.

It is thus already known to verify a light-emitting diode or a plurality of light-emitting diodes in such a way that a colour sensor is available which measures the luminescence property of a light-emitting diode. In this context, sensors based on CCD or CMOS technology are known. These conventionally used components are relatively large and therefore conflict with a compact construction. In addition, they measure in a complex manner within particular wave ranges so as to analyse a coloured luminescence property of the light-emitting diodes to be tested. The prior art therefore provides relatively complex colour sensors, since often absolute values have to be measured exactly and in addition particular colour spectra have to be analysed, for example using a red-blue-green scheme RGB. However, this involves considerable technical complexity in practice.

Generally, different constructions and arrangements of light-emitting diodes are known, but these are subject to an aging process. This may for example arise from the fact that during operation of the light-emitting diodes there is a development of heat, which in turn leads to or intensifies a corresponding aging process in the light-emitting diode. This aging process makes itself felt in that the light-emitting diode as a whole loses luminosity. Thus, if a light-emitting diode is addressed with a first current intensity and addressed with the same current intensity again over a longer aging process, this results in a brighter luminosity in the first test run than in the second test run.

This is particularly disadvantageous in the present case because the present invention relates in particular to the automotive field, where there are considerable safety requirements. These safety requirements are specified in various DIN standards, among others, and are to be adhered to at the manufacturer.

Thus, in relation to the prior art, it is particularly disadvantageous that an aging process occurs in the light-emitting diodes which can only be compensated with considerable technical complexity. In particular, it is disadvantageous in this context that colour sensors are used which are particularly unsuitable in construction and in addition bring about high additional technical complexity. Thus, manufacturing a colour sensor is already technically complex per se. Thus, in known methods, a person skilled in the art has a choice as to whether he simply accepts the aging process of light-emitting diodes or compensates this aging process in a technically complex manner.

In this context, it is thus desirable to provide a method and a corresponding system arrangement which make it possible for the end customer to obtain a light-emitting diode or a plurality of light-emitting diodes which constantly have the same luminescence properties even over a number of years. In this context, it is a requirement on the manufacturer that the changes in the luminescence properties can be detected in a technically simple manner and in particular particularly reliably.

It is thus an object of the present invention to propose a measurement arrangement for detecting aging processes in individual light-emitting diodes. Further, it is an object of the present invention to propose a corresponding method for detecting aging processes in individual light-emitting diodes and a computer program product comprising control commands which implement the proposed method.

The object is achieved by a measurement arrangement for detecting aging processes having the features of claim 1. Further advantageous embodiments are set out in the dependent claims.

Accordingly, a measurement arrangement for detecting aging processes in individual light-emitting diodes is proposed, having a plurality of light-emitting diodes, a control unit set up for individual brightness intensity regulation of each of the light-emitting diodes, at least one photodiode set up for measuring the brightness of at least one light-emitting diode being provided, the control unit being set up to detect a relative change in brightness intensity of each light-emitting diode as a function of a first measurement and a second time-offset measurement.

The present invention has the advantage that aging processes which result in a change in brightness intensity can be both detected and compensated. For this purpose, individual light-emitting diodes are provided, which are typically in the form of RGB light-emitting diodes. However, the present invention is not limited hereto, but rather relates to any desired number of light-emitting diodes to be monitored. Thus, the number of light-emitting diodes comprised in the plurality of light-emitting diodes may preferably be three or four light-emitting diodes. Further, however, it is also possible for different light-emitting diodes to be connected in series and thus for the entire series of light-emitting diodes to be monitored. It is thus an aspect of the present invention that a plurality of light-emitting diodes comprises three or four light-emitting diodes and a multiple of this number may be present by way of connection in series.

Further, a control unit is provided which addresses the individual light-emitting diodes of the plurality of light-emitting diodes. Typically, this takes place in that a particular current intensity or a voltage is applied to each individual light-emitting diode and thus a particular brightness intensity is also implicitly set. As was described previously at the outset, in light-emitting diodes it is particularly disadvantageous that an applied voltage does not constantly bring about the same brightness at every point in time. Thus, the control unit is generally capable of addressing the individual light-emitting diodes in such a way that they also increase in brightness. Thus, if an aging process occurs in a light-emitting diode, the applied voltage must be increased over this time in such a way that the same brightness is constantly brought about.

Thus, the control unit is set up to regulate the individual brightness intensity of each light-emitting diode. Individually regulating brightness intensity is based on it also actually being possible to address the individual light-emitting diodes individually. Thus, the actual brightness of each light-emitting diode can also be set individually. It is further possible to set a mixing ratio of the individual light-emitting diodes, by means of the control unit, in such a way that a particular colour value is achieved. Thus, for example a red-light light-emitting diode, a green-light light-emitting diode and a blue-light light-emitting diode can be set in intensity in such a way that a particular colour value is set. However, if individual light-emitting diodes lose luminosity in this context, this results in disruption to this same mixing ratio.

According to the invention, it is particularly advantageous that a photodiode is used. In relation to the prior art, this has in particular the advantage that a photodiode can be provided in a particularly simple technical manner and the readout is low in technical complexity. Whilst colour sensors are thus used in the prior art, according to the invention it is particularly surprisingly found that a particular otherwise disadvantageous error tolerance in the photodiode is negligible. This is the case because there is no dependency on the absolute vales measured in conventional methods, but rather two measurements are taken with a time offset, and by way of the photodiode merely the relative difference between the two measurement results is to be established. Thus, it is particularly advantageous according to the invention that in this case particularly simple photodiodes can be used. A person skilled in the art is generally discouraged from this, since photodiodes often measure less exactly than colour sensors and do not even necessarily actually measure a colour spectrum. Thus, a relatively cost-effective measuring sensor can be provided, the measurement tolerance of which does not have a disadvantageous effect on the result of the brightness intensity measurement. Therefore, a measurement device in the form of a photodiode may be used, and can be operated reliably and with low technical complexity.

For measuring the brightness intensity of at least one light-emitting diode, the photodiode or the at least one photodiode is arranged in such a way with respect to the light-emitting diode to be measured that an optical line of sight is possible. Alternatively, it is also possible for there to be no line of sight between the photodiode and the light-emitting diode, but rather for the photodiode to be orientated in such a way that it merely measures reflected passive light. In this context, a person skilled in the art is aware of further arrangements which make it possible for a photodiode to calibrate a light source. In this context, it is particularly advantageous for the photodiode to be located in physical proximity to the light-emitting diode. In this context too, a tolerance is particularly advantageously allowed, since the present method or the proposed measurement arrangement is merely based on relative values. Thus, the physical distance between the photodiode and the light-emitting diode need not be specifically defined, but rather it is advantageous if the photodiode is constantly arranged at the same position or distance with respect to the light-emitting diode during the measurements.

Further, it is possible to measure a brightness intensity of exactly one light-emitting diode by means of a photodiode or else to calibrate a plurality of light-emitting diodes by means of one photodiode. Thus, the photodiode may be arranged in such a way with respect to one or more light-emitting diodes that a corresponding luminescence property or brightness intensity can be calibrated. In particular, it is possible to configure a photodiode in such a way that it can measure in a wide-band or multi-band manner. Thus, it is particularly advantageous for any desired subset of red, green and blue light to be measurable using a single photodiode. This can take place in such a way that the photodiode is configured so as to be able to measure the individual spectra of different light-emitting diodes. Thus, even a single photodiode is sufficient to calibrate any desired number of light-emitting diodes, preferably three or four, which each emit a characteristic wavelength. Further, it is also possible to provide an individual special photodiode for each individual light-emitting diode. In this context, the photodiode may be arranged in physical proximity to the light-emitting diode which this same photodiode is to calibrate.

Further, it is also possible to arrange photodiodes redundantly in such a way that a plurality of photodiodes are actually provided for one light-emitting diode. In this way, failure of a photodiode can be circumvented. Further, it is possible to average the measurement values of individual photodiodes, resulting in a particularly reliable average value.

As a result of the aging process, a first measurement and a time-offset second measurement of the brightness intensity of at least one light-emitting diode are taken. This may involve a constantly recurring measurement interval, but the second measurement may also be taken only after a predetermined time period, depending on the start time of the first measurement. In this context, a measurement time may be stored statically, or a relative measurement interval is determined, after which the second measurement is taken as a function of the first measurement. It is further possible to set the measurement interval, or the time offset, as a function of a light-emitting diode use. It is thus advantageous for light-emitting diodes which are used particularly frequently or for a particularly long time to be calibrated more frequently, and in this context for a change in brightness intensity to be determined with respect to at least one past measurement point. Thus, the present invention is in no way limited to a first measurement and a second, time-offset measurement, but rather a plurality of measurements may be taken, the preceding second, time-offset measurement in turn becoming the first measurement and thus forming a relatively start time for a further second measurement. Thus, any desired number of time-offset measurements is possible, with respect to which the relative change in brightness intensity can be determined according to the invention. In this context, it is possible to set any desired time offset so as to satisfy the underlying application scenario of the light-emitting diodes.

Thus, in the first measurement a brightness intensity of at least one light-emitting diode is measured, and in the second, time-offset measurement a second brightness intensity of the previously measured light-emitting diode or light-emitting diodes is measured. From this, the relative change in brightness intensity can be determined. This may for example involve subtraction of the two brightness intensities. In this context, it should be noted in particular that according to the present invention the absolute values are not taken as a basis, but rather only the relative changes in brightness intensity are used, in such a way that the difference present is compensated in accordance with the further, optional method steps or using further optional structural features.

Thus, according to the invention there is in particular the advantage that inexactness in the measurement of the absolute brightness intensities can be accepted, without the expectation of a distorted result in this context. Even if a photodiode were faulty, the same error would occur in the first measurement as in the second measurement. Thus, the change in brightness intensity can still be determined correctly, and accordingly the change in brightness intensity can also be compensated. If for example the relative change in brightness intensity shows that the luminosity has fallen by a particular percentage, the control unit can also increase the applied voltage by this same percentage, in such a way that the same brightness intensity is set again. In this context, a person skilled in the art will appreciate the extent to which there is a linear relationship between the applied voltage and the change in brightness intensity. A person skilled in the art will thus also appreciate the extent to which he now has to control a light-emitting diode so as to compensate a change in brightness intensity. Thus, a measurement arrangement along with a corresponding method for detecting and compensating aging processes, or for correcting them, is being proposed.

In one aspect of the present invention, the control unit is set up substantially to compensate the detected change in brightness intensity. This has the advantage that the change in brightness intensity can be compensated at least in such a way that the human user cannot detect any changed luminosity properties of the light-emitting diodes. Thus, directly after the second measurement, the change in brightness intensity can be compensated in such a way that the original luminosity of the individual light-emitting diode is set again. In this context, it is particularly preferred for the change in brightness intensity to be fully compensated, but this may in turn be highly technically complex. Thus, according to the invention it is particularly preferred for the change in brightness intensity to be substantially compensated. However, the end customer, for example a car driver, does not notice any difference in the luminosity or in the mixing ratio of the individual light-emitting diodes even after many years of use.

In a further aspect of the present invention, the at least one light-emitting diode is controlled in such a way that the brightness intensity of the first measurement is set. This has the advantage that the first measurement can be stored as a reference point and subsequently, after the second, time-offset measurement, the original luminosity or brightness intensity can be set again. It is thus ensured that over the entire life cycle of the light-emitting diode the brightness intensity value can be constantly set as it was able to be generated at the time of manufacture of the light-emitting diode. In this context, it should be noted that a brightness intensity measurement may also be taken as a function of an applied voltage or an applied current. Thus, the light-emitting diode has to be operated constantly with the same parameters for the first measurement and the second measurement so as actually even to establish the change in brightness intensity due to the aging process. It is thus possible to dim the light-emitting diode or light-emitting diodes using pulse-width modulation. Thus, if a light-emitting diode is operated at 100% for the first measurement, it also has to be operated at 100% for the second measurement. By contrast, if the light-emitting diode is dimmed to 50% for the first measurement process, it also has to be correspondingly dimmed for the second measurement. The possibility of pulse-width modulation for dimming the light-emitting diodes is already known to a person skilled in the art in this context.

In a further aspect of the present invention, the plurality of light-emitting diodes and the at least one photodiode are arranged in a housing. This has the advantage that the photodiode can be shielded in such a way that merely a brightness intensity of the light-emitting diodes to be measured can be detected. Thus, according to the invention, the possibility is excluded of further light sources being able to act on the photodiodes and thus to distort the measurement results. This is advantageous in particular because in light-emitting diodes a housing always needs to be provided, and thus the photodiode or photodiodes can be introduced into this pre-existing housing. Thus, the light-emitting diodes and the photodiodes can be arranged in the housing in one working step.

In a further aspect of the present invention, the plurality of light-emitting diodes and the at least one photodiode are formed in a single piece. This has the advantage that the light-emitting diodes and the photodiodes are arranged in such a way with respect to one another that they cannot be separated without destroying them. This is preferably implemented in such a way that the light-emitting diodes and the photodiodes are arranged in a shared housing, in such a way that the housing having the light-emitting diodes and the photodiodes forms a unit. In this context, it is not necessarily required for the light-emitting diodes and the photodiode to be arranged in such a way with respect to one another that they are in contact. Rather, the proposed measurement arrangement can be packed in a housing in such a way that it can be delivered as a single-piece unit.

In a further aspect of the present invention, the control unit is in the form of a microcontroller, a finite state machine, an analogue control circuit and/or an electronic component. This has the advantage that the control unit can be manufactured using a plurality of constructions, and in particular that existing control units can be reused. In this context, a person skilled in the art will appreciate that the control unit may also have further components, for example a light-emitting diode driver.

In a further aspect of the present invention, the plurality of light-emitting diodes is in the form of a red light-emitting diode, a green light-emitting diode and a blue light-emitting diode. This has the advantage that existing control methods and in particular existing light-emitting diode arrangements can still be used according to the invention. Thus, by way of the proposed light-emitting diodes, any desired colour value, in other words wavelength, can be set using a mixing ratio. Thus, even existing light-emitting diodes can be retrofitted in an inventive manner in such a way that merely photodiodes have to be provided for this purpose. Thus, the proposed measurement arrangement or the proposed method is also suitable for retrofitting existing light-emitting diodes, in such a way that a plurality of light-emitting diodes and a control unit are provided. In further method steps, the photodiodes or the photodiode are provided and the control unit is adapted in accordance with the characterising part of the independent claim relating to the measurement arrangement.

In a further aspect of the present invention, the plurality of light-emitting diodes is in the form of a red light-emitting diode, a green light-emitting diode, a blue light-emitting diode and a white light-emitting diode. This has the advantage that even existing light-emitting diodes can be reused and in particular that the proposed measurement arrangement or the proposed method can be applied to any construction of light-emitting diodes.

In a further aspect of the present invention, the photodiode is configured to be wide-band. This has the advantage that by means of the photodiode a plurality of colour spectra can be measured in such a way that a brightness intensity measurement can be taken for each of the proposed light-emitting diodes of different wavelengths. Thus, the advantage also occurs that for example merely one individual photodiode has to be provided, and can subsequently measure the colour spectra, for example red, green and blue, separately. However, the use of a CCD sensor or CMOS sensor is omitted in this context. Rather, an individual photodiode is to be provided, which can calibrate the individual light-emitting diodes separately.

In a further aspect of the present invention, a photodiode is provided for each of the green light-emitting diode and the blue light-emitting diode. This has the advantage that precisely those light-emitting diodes which are particularly temperature-susceptible are monitored using a photodiode of their own. In this context, it has surprisingly been found that a red light-emitting diode is subject to a lesser aging process than the further light-emitting diodes, since a red light-emitting diode produces less heat than a green or blue light-emitting diode. It is thus particularly advantageous according to the invention for merely two photodiodes or three photodiodes to be provided even if three or four light-emitting diodes are installed. Thus, the red light-emitting diode can constantly remain unmonitored, since it actually has less development of heat, and thus the corresponding photodiode can be omitted. This in turn results in a particularly robust measurement system which can additionally be manufactured at a low technical complexity. Further, the proposed measurement arrangement can be operated efficiently, and this is advantageous in particular if various measurement arrangements are connected in series.

In a further aspect of the present invention, a separate photodiode is provided for each light-emitting diode, and measures the brightness intensity thereof. This has the advantage that for each light-emitting diode the corresponding change in brightness intensity can be measured particularly reliably. If the plurality of light-emitting diodes has for example three light-emitting diodes, three photodiodes are also provided, and indeed four photodiodes are also provided in the case of four light-emitting diodes. As a result, a change in the brightness intensity of individual lights can be established particularly exactly.

In a further aspect of the present invention, the change in brightness intensity is detected as a function of a user input. This has the advantage that a user who prefers a particular colour spectrum can also set this for example as internal lighting of his vehicle. Since this colour spectrum and thus also operation of the corresponding light-emitting diode occur particularly often, there is a more intensive or more rapid aging process here than in the further light-emitting diodes. For example, if a user generally selects red internal lighting of his vehicle, specifically the red light-emitting diode is subjected to increased wear or an increased aging process. It is thus possible to take the first measurement and the second measurement particularly frequently for the red light-emitting diode. Thus, the change in brightness intensity is detected more frequently and can accordingly be compensated.

However, if a user input is present which provides that a particular light-emitting diode is never addressed, this light-emitting diode also does not have to have the change in brightness intensity thereof detected and compensated. In this context, however, it appears advantageous to determine the change in brightness intensity at least occasionally, since a natural aging process may also occur. Thus, the measurements, the detection and the compensation are carried out at different frequencies at different light-emitting diodes. As a result, technical complexity is in turn reduced.

The object is also achieved by a method for detecting aging processes in individual light-emitting diodes, having the steps of providing a plurality of light-emitting diodes and providing control unit set up for individually regulating the brightness intensity of each of the light-emitting diodes, at least one photodiode set up for measuring the brightness intensity of at least one light-emitting diode being provided, the control unit detecting a relative change in brightness intensity of each light-emitting diode as a function of a first measurement and a second, time-offset measurement.

In a further aspect of the present invention, the detected change in brightness intensity is substantially compensated. This has the advantage that the change in brightness intensity is not merely detected, but also actually compensated. Substantially means that the change in brightness intensity is compensated entirely or at least in such a way that the human user does not perceive a deviation in colour.

The object is also achieved by a computer program product comprising control commands which implement the proposed method or operate the proposed measurement arrangement. The method can thus be provided as software or in hardware.

In this context, it is particularly advantageous for the proposed measurement arrangement to have structural features which can equally be implemented as method steps. Further, the proposed method steps can also be reproduced as structural features of the measurement arrangement. In this context, the computer program product is suitable to implement the individual method steps or to operate the measurement arrangement or at least to operate individual components. As a whole, the provided functionality can thus also be implemented by the measurement arrangement as method steps.

Figure 2:
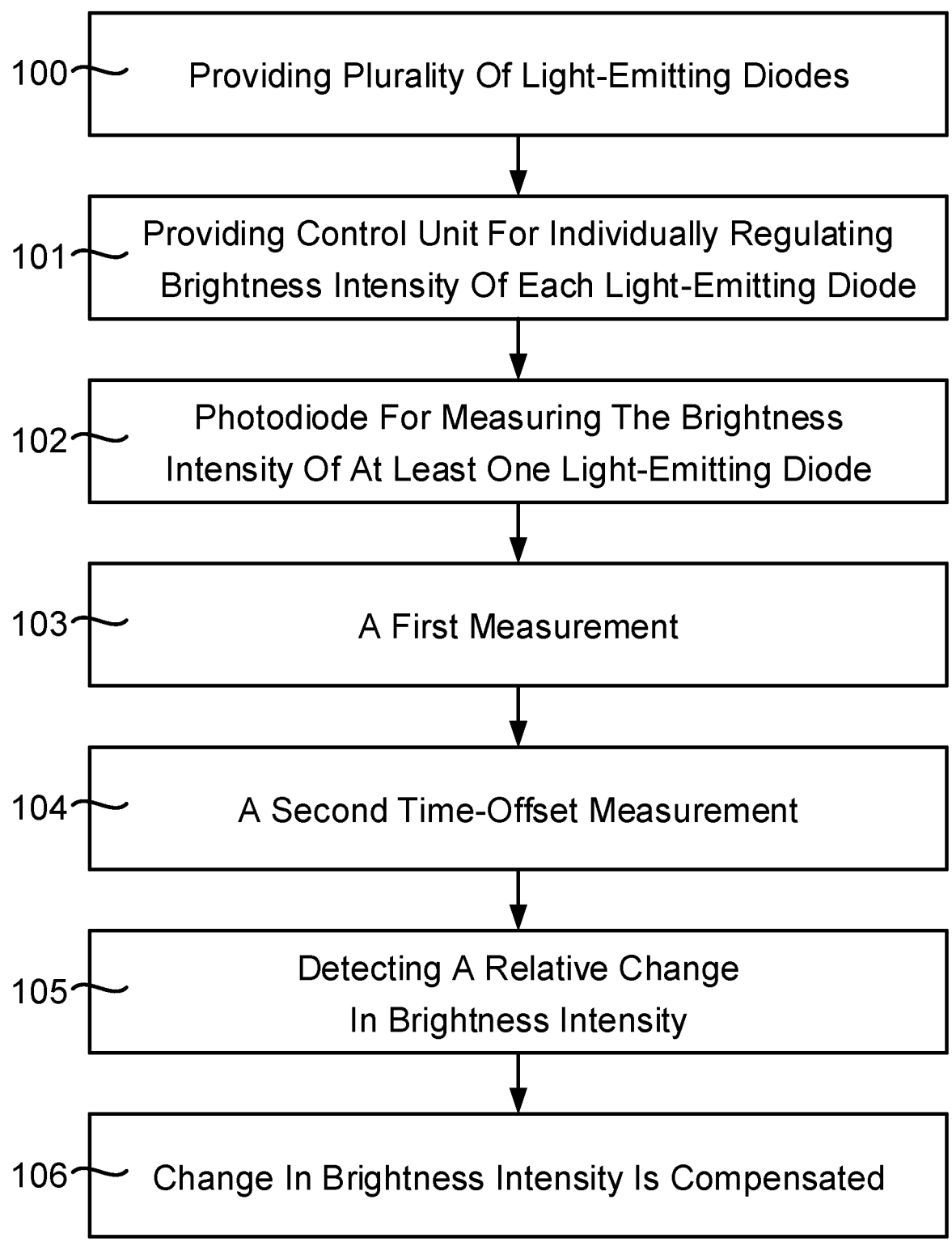

Further advantageous embodiments are described in greater detail by way of the accompanying drawings, in which:

FIG. 1 is a block diagram of a measurement arrangement for detecting aging processes in accordance with an aspect of the present invention; and FIG. 2 is a schematic flow chart of a method for detecting aging processes in accordance with a further aspect of the present invention.

FIG. 1 is a plan view of the proposed compact light-emitting diode arrangement, light-emitting diodes LED being arranged on the left side. In the present case, these are a red R, a green G and a blue B light-emitting diode LED. An MLED controller, in other words a control unit CTRL, is arranged on the right side. Further, in proximity to each light-emitting diode, a photodiode FD is arranged in such a way that the photodiode can measure the brightness intensity of the corresponding light-emitting diode. In this context, the photodiodes are communicatively coupled to the control unit. In the control unit, a logic is implemented which causes the control unit to trigger the proposed measurements and to receive the corresponding measurement values. From the first measurement and the second measurement, the control unit can thus determine the relative change in brightness intensity.

As can be seen in the present FIG. 1, all necessary components are installed within the housing. Thus, the control unit and the light-emitting diode s can be placed in the same housing. The housing is configured in such a way that it is configured opaque in part, transparent or semi-transparent window regions being provided. By means of these window regions, it is possible to perceive the set brightness intensity of the individual light-emitting diode s from outside the housing. This can be manifested in that the light-emitting diodes are addressed in a particular mixing ratio, in such a way that a predetermined colour value is set. Thus, the operation of the LEDs is manifested by way of a coloured light. In particular a chip housing, also known as a package, is suitable as a housing.

In this context, the window region is typically not completely transparent, in such a way that a particular percentage of the generated light of the light-emitting diodes is reflected back into the housing again. In this context, according to the invention it is in turn particularly advantageous that the photodiodes merely determine the relative change in brightness intensity and thus do not merely take a brightness intensity measurement of the individual light-emitting diodes, but rather all involved system components, for example even including the reflecting window region, are taken into account. In conventional methods, this would lead to distortion of the measurement results, since in the prior art absolute intensity values are typically used. Thus, in the present case the dimensioning, in other words the dimensions, of the housing are cancelled out, since again merely a relative value of the change in brightness intensity is used. In conventional methods, the absolute measurement values can be distorted simply in that the housing of a first plurality of light-emitting diodes is configured differently from the housing of a second plurality of light-emitting diodes. Since in conventional methods merely static values are used, these do not react flexibly to specific configurations of further system components, such as the window region and the hosing dimensions.

According to the invention, no distortion occurs in this context, since the change in brightness intensity is constantly measured under the same conditions. Thus, this same change is also reliably compensated. The proposed measurement arrangement or the proposed method is thus suitable in particular in an automotive application scenario, since the light-emitting diodes may be safety-relevant and in particular be read off in a machine-based manner during autonomous travel. It is thus absolutely necessary to detect and compensate deviations in a brightness intensity. Thus, according to the invention, the advantage occurs that the proposed measurement method and the measurement arrangement work particularly reliably and in particular provide or operate high-colour-fidelity light-emitting diodes.

FIG. 2 is a schematic flow chart of a method for detecting aging processes in individual light-emitting diodes, having the steps of providing 100 a plurality of light-emitting diodes, providing 101 a control unit set up for individually regulating the brightness intensity of each of the light-emitting diodes, at least one photodiode set up for measuring the brightness intensity of at least one light-emitting diode being provided 102, the control unit detecting 105 a relative change in brightness intensity in each light-emitting diode as a function of a first measurement 103 and a second, time-offset measurement 104. In a further, optional method step 106, the change in brightness intensity is compensated entirely or at least approximately.

A computer program product comprising control commands which implement the method or operate the proposed measurement arrangement is not shown herein. Generally, the method may be provided as software or in hardware.

The invention claimed is:

1. A measurement arrangement for detecting aging processes in individual light-emitting diodes, comprising:
    a plurality of light-emitting diodes including a red light-emitting diode, a green light-emitting diode and a blue light-emitting diode;
    at least two photodiodes arranged to measure brightness intensity of corresponding green and blue light-emitting diodes, wherein the red light-emitting diode is not monitorable; and
    a control unit arranged to individually regulate the brightness intensity of each of the light-emitting diodes, the control unit configured to detect a relative change in brightness intensity of each light-emitting diode as a function of a first measurement and a second, time-offset measurement.

2. The measurement arrangement according to claim 1, wherein the control unit is arranged to substantially compensate the detected change in brightness intensity.

3. The measurement arrangement according to claim 1, wherein each one light-emitting diode is controlled in such a way that the brightness intensity of the first measurement is set.

4. The measurement arrangement according to claim 1, wherein the plurality of light-emitting diodes and the at least two photodiodes are arranged in a housing.

5. The measurement arrangement according to claim 1, wherein the plurality of light-emitting diodes and the at least two photodiodes are formed in a single piece.

6. The measurement arrangement according to claim 1, wherein the control unit is in the form of a microcontroller, a finite state machine, an analogue control circuit and/or an electronic component.

7. The measurement arrangement according to claim 1, wherein the plurality of light-emitting diodes is in the form of a red light-emitting diode, a green light-emitting diode, a blue light-emitting diode and a white light-emitting diode.

8. The measurement arrangement according to claim 1, wherein the change in brightness intensity is detected as a function of a user input.

9. A method for detecting aging processes in individual light-emitting diodes, comprising the steps of:
    providing a plurality of light-emitting diodes including a red light-emitting diode, a green light-emitting diode and a blue light-emitting diode;
    providing at least two photodiodes arranged to measure brightness intensity of corresponding green and blue light-emitting diodes, wherein the red light-emitting diode is not monitorable; and
    providing a control unit arranged to individually regulate the brightness intensity of each of the light-emitting diodes, the control unit detecting a relative change in brightness intensity in each light-emitting diode as a function of a first measurement and a second, time-offset measurement.

10. The method according to claim 9, wherein the detected change in brightness intensity is substantially compensated.

11. A computer program product comprising control commands which implement the method according to claim 9.

\* \* \* \* \*